(12) United States Patent
Liao

(10) Patent No.: US 6,256,195 B1
(45) Date of Patent: Jul. 3, 2001

(54) SECURING DEVICE OF COMPUTER DATA STORAGE

(75) Inventor: Nien-Chiang Liao, Lu-Chou (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/428,294

(22) Filed: Oct. 27, 1999

(30) Foreign Application Priority Data

Apr. 6, 1999 (TW) ................................................ 88205236

(51) Int. Cl.7 .............................. H05K 5/00; H05K 7/00; H05K 5/02; G06F 1/16
(52) U.S. Cl. .......................... 361/685; 361/686; 361/683; 361/728; 361/747; 361/725; 364/208.1; 248/222.41
(58) Field of Search ..................................... 361/685, 684, 361/686, 724, 725, 728, 747, 683; 312/332.1, 333, 223.2, 223.1, 251.1; 360/98.01; 248/222.41, 685, 693, 200, 205.1, 300, 309.1, 225.11, 291.1, 240; 364/708.1

(56) References Cited

U.S. PATENT DOCUMENTS

| 3,582,948 | * | 6/1971 | Mitchell et al. | ...................... 340/381 |
| 3,646,622 | * | 3/1972 | Van Riper, Jr. | ........................... 5/100 |
| 3,713,181 | * | 1/1973 | Hougland | ............................. 5/176 R |
| 4,684,764 | * | 8/1987 | Luzzi et al. | ............................. 174/91 |
| 4,758,181 | * | 7/1988 | Reedy | ................................... 439/546 |
| 5,067,041 | * | 11/1991 | Cooke et al. | ........................ 361/394 |
| 5,136,466 | * | 8/1992 | Remise et al. | ....................... 361/391 |
| 5,211,566 | * | 5/1993 | Bates et al. | ............................. 439/66 |
| 5,227,954 | * | 7/1993 | Twigg | ................................... 361/391 |
| 5,293,915 | * | 3/1994 | Fuchs et al. | ...................... 144/134 D |
| 5,332,306 | * | 7/1994 | Babb et al. | ........................ 312/334.16 |
| 5,343,357 | * | 8/1994 | Driscoll et al. | ....................... 361/685 |
| 5,447,367 | * | 9/1995 | Wei | .................................. 312/223.2 |
| 5,483,419 | * | 1/1996 | Kaczeus, Sr. et al. | .............. 361/685 |
| 5,579,204 | * | 11/1996 | Nelson et al. | ....................... 361/685 |
| 5,768,097 | * | 6/1998 | Jelinger | ................................. 361/683 |
| 5,818,689 | * | 10/1998 | Johns et al. | .......................... 361/685 |
| 5,995,364 | * | 11/1999 | McAnally et al. | ................... 361/685 |
| 6,122,173 | * | 9/2000 | Felcman et al. | ..................... 361/726 |

FOREIGN PATENT DOCUMENTS

| 607371 | * | 12/1978 | (CH) | ................................... 362/406 |
| 4115462 | * | 1/1992 | (DE) | ..................................... 385/53 |
| 0171349 | * | 2/1986 | (EP) | .................................... 439/797 |
| 2156894 | * | 10/1985 | (GB) | ............................. F16B/21/04 |

* cited by examiner

Primary Examiner—Leo P. Picard
Assistant Examiner—Anatoly Vortman
(74) Attorney, Agent, or Firm—Wei Te Chung

(57) ABSTRACT

A device for securing a computer data storage device in a computer enclosure includes a carrier fixed in the enclosure and defining a space for accommodating the data storage device. The carrier has a bottom plate and opposite side plate extending from the bottom plate. At least one slot is defined in the plates of the carrier. The slot has an inner end around which a raised portion of is formed on the corresponding plate of the carrier. A projection is mounted to a corresponding face of the data storage device and the projection has an expanded head separated from the face a predetermined distance whereby the projection is received in the slot and retained at the inner end thereof with the head engaging with and interacting with the raised portion for applying a force to the data storage device to securely fix the data storage device in the carrier.

16 Claims, 7 Drawing Sheets

SECURING DEVICE OF COMPUTER DATA STORAGE

BACKGROUND OF THE INVENTION

1. Field of the Invention

The present invention generally relates to a device for securing computer data storage in a computer enclosure, and in particular to a securing device of computer data storage that allows ready and efficient mounting/dismounting of the data storage without use of a hand tool.

2. The Prior Art

A computer comprises data storage devices, such as hard disk drive, floppy disk drive and CD-ROM for storage of data. Conventionally, the data storage devices are fixed in a computer enclosure by bolts. Thus, it requires tools to tighten and loosen the bolts. The tightening/loosening operation is laborious and time-consuming.

Examples of conventional techniques used to secure a data storage device, such as a disk drive, in a computer enclosure are disclosed in Taiwan Patent Application Nos. 76201340, 80212451 and 80212301. These conventional techniques suffer complicated structure, high cost and laborious operation of mounting bolts.

Another example of conventional technique for securing a disk drive is disclosed in U.S. Pat. No. 5,301,088 and Taiwan Patent Application No. 81209653. Resilient members are adopted to fix the disk drive. Such resilient members are not capable to soundly support the disk drive.

Other examples of the related technique are disclosed in Taiwan Patent Application No. 80206874 and U.S. Pat. Nos. 5,564,804 and 5,599,080.

It is thus desired to provide a device for securing a computer data storage device that overcomes the above problems.

SUMMARY OF THE INVENTION

Accordingly, an object of the present invention is to provide a device for efficiently mounting/dismounting a computer data storage device.

Another object of the present invention is to provide a device for securing a computer data storage device in a computer enclosure without using a tool.

A further object of the present invention is to provide a device having a simple structure for efficiently securing a computer data storage device.

To achieve the above objects, a securing device in accordance with the present invention that secures a computer data storage device in a computer enclosure comprises a carrier fixed in the enclosure and defining a space for accommodating the data storage device. The carrier has a bottom plate and opposite side plate extending from the bottom plate. At least one slot is defined in the plates of the carrier. The slot has an inner end around which a raised portion of is formed on the corresponding plate of the carrier. A projection is mounted to a corresponding face of the data storage device and the projection has an expanded head separated from the face a predetermined distance whereby the projection is received in the slot and retained at the inner end thereof with the head engaging with and interacting with the raised portion for applying a force to the data storage device to securely fix the data storage device in the carrier.

BRIEF DESCRIPTION OF THE DRAWINGS

The present invention will be apparent to those skilled in the art by reading the following description of preferred embodiments thereof, with reference to the accompanying drawings, in which.

DETAILED DESCRIPTION OF THE PREFERRED EMBODIMENTS

Figure 1:
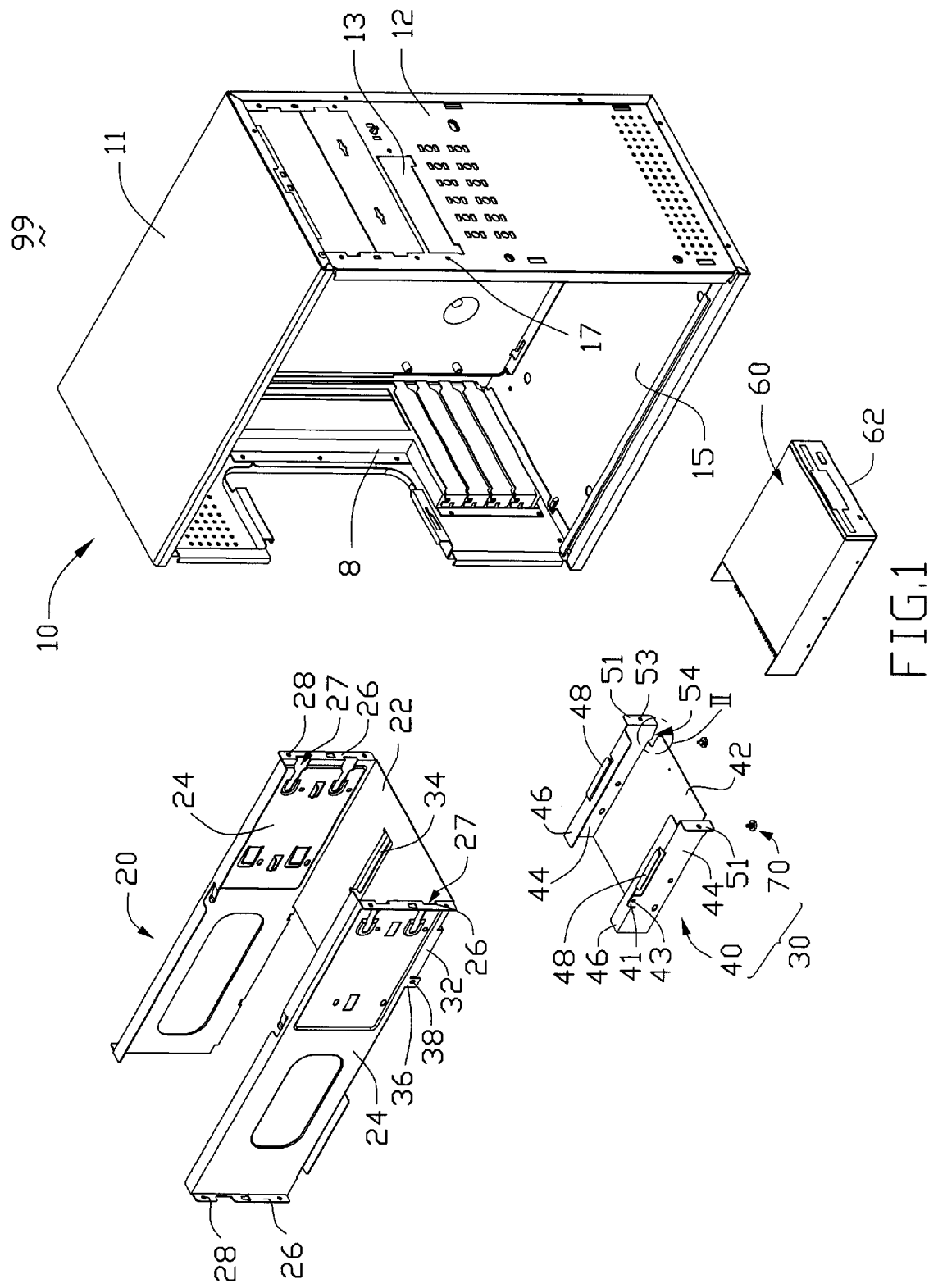
FIG. 1 is an exploded view of a computer enclosure in which a securing device constructed in accordance with the present invention is incorporated to secure a data storage device.

Referring to the drawings and in particular to FIG. 1, a computer enclosure designated by reference numeral 99 comprises a chassis 10 having top and bottom panels 11, 15 connected to each other by front and rear panels 12, 8 for defining an interior space (not labeled) to accommodate a data storage device carrier 20 extending between the front and rear panels 12, 8 and a disk drive carrier 40 mounted to an underside of the data storage device carrier 20 and the front panel 12. A disk drive 60 is received and retained in the disk drive carrier 40 by means of a securing device 30 constructed in accordance with the present invention. The securing device 30 will be further described.

The data storage device carrier 20 comprises bottom wall 22 and two upright side walls 24 extending from the bottom wall 22 defining a space therebetween for receiving computer data storage, such as CD-ROM (not shown). The side walls 24 form flanges 26 for abutting against the front and rear panels 12, 8 of the chassis 10. Holes 28 are defined in the flanges 26 for receiving fasteners (not shown) that secure the data storage device carrier 20 to the front and rear panels 12, 8 of the chassis 10. Slots 27 are defined in the side walls 24 for receiving projections formed on the data storage device to be received in the data storage device carrier 20 for retaining the data storage device therein.

Two opposite rails 32, 34 are formed on the underside of the bottom wall 22. In the embodiment illustrated, the rails 32, 34 are L-shaped extending from the bottom wall 22 and are opposite to each other. The disk drive carrier 40 comprises a bottom plate 42 from which opposite side plates 44 extend defining a space therebetween for accommodating the disk drive 60. The disk drive 60 is a floppy disk drive in this case, but may be other types of data storage devices, such as a hard disk drive. Preferably, the disk drive 60 has a width substantially snugly received between the side plates 44 of the disk drive carrier 40.

Each side plate 44 has a top flange 46 extending toward each other and each top flange 46 forms an L-shaped slide tab 48 extending away from each other. The slide tabs 48 are slidably received in the rails 32, 34 of the data storage device carrier 20 for attaching the disk drive carrier 40 to the data storage device carrier 20. Each side plate 44 also forms a front flange 51 for abutting against the front panel 12 of the chassis 10. Aligned holes 53, 17 are defined in the front flanges 51 of the disk drive carrier 40 and the front panel 12 of the chassis 10 for receiving fasteners (not shown) to secure the disk drive carrier 40 to the front panel 12 of the chassis 10. Preferably, a lug 41 extends from one of the side plates 44 and defines a hole 43 therein. A corresponding tab 36 is formed on the underside of the data storage device carrier 20 and defines a hole 38 therein corresponding to the hole 43. The lug 41 and the tab 36 are held against each other with the holes 38, 43 aligned for receiving a fastener (not shown) that secures the lug 43 to the tab 36.

Figure 3:
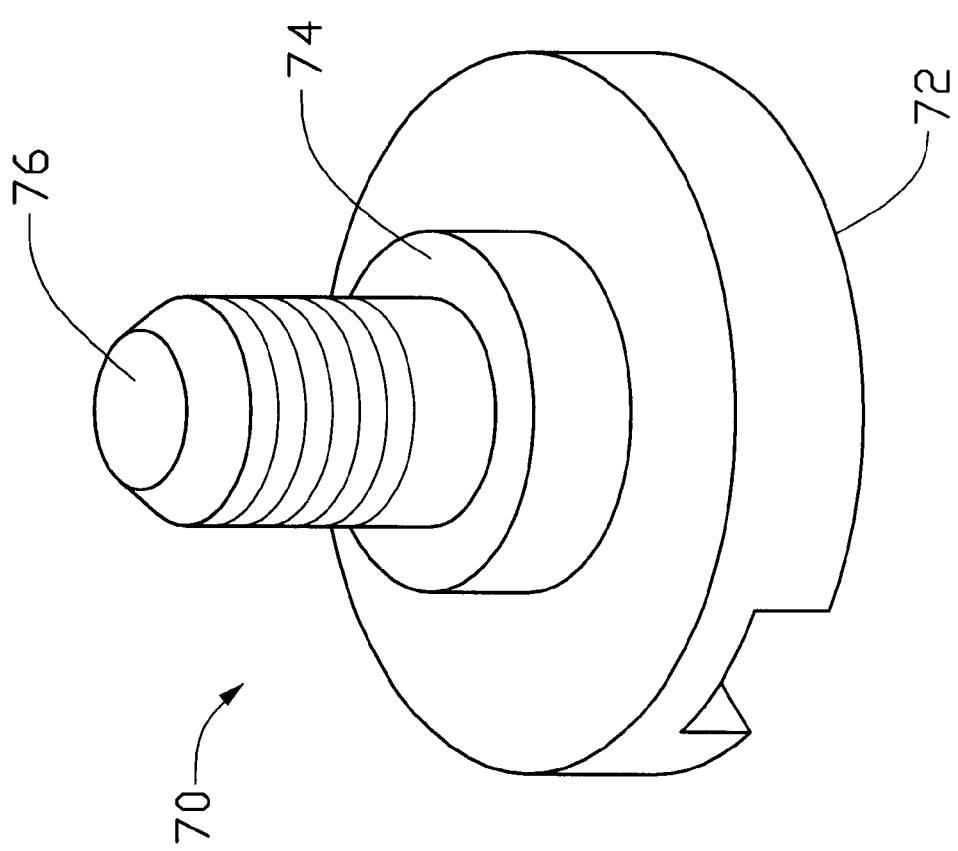
FIG. 3 is a perspective view of a bolt that retains the data storage device in the disk drive carrier.
Figure 4:
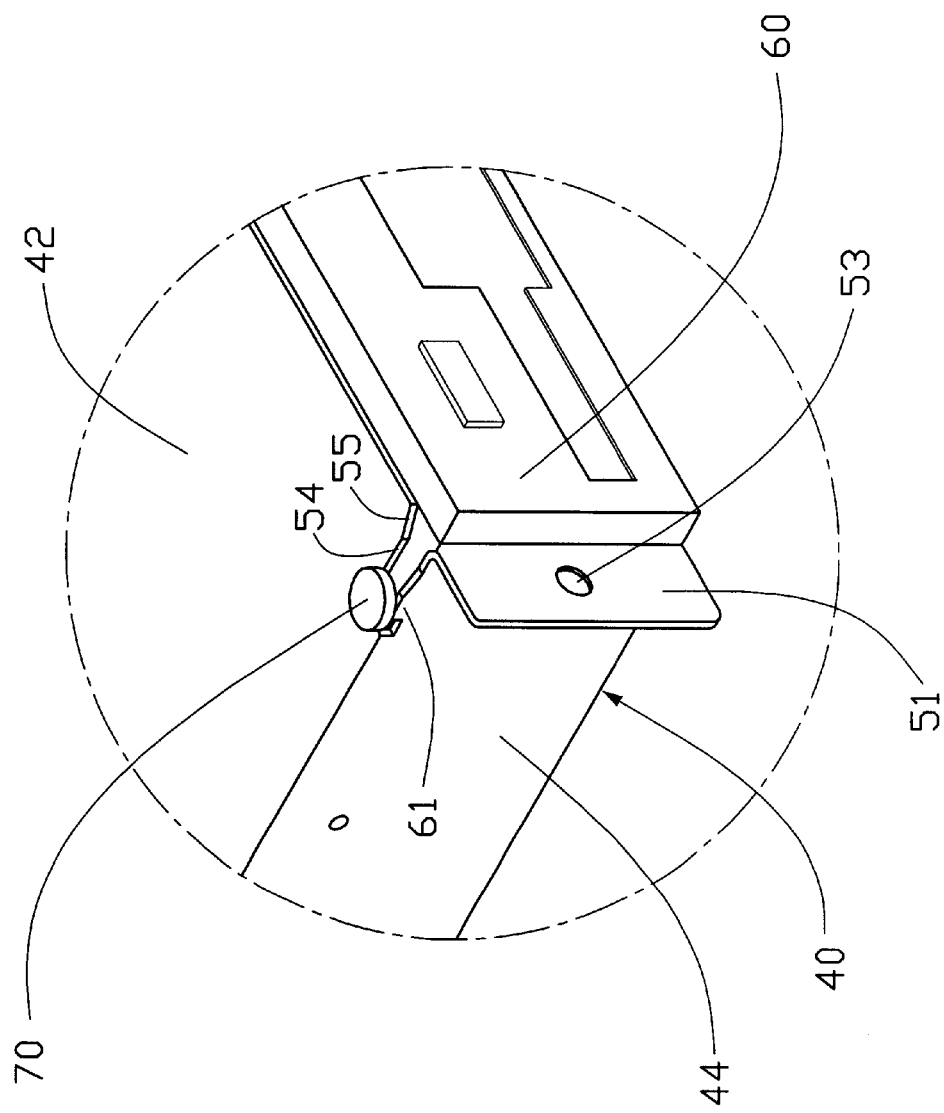
FIG. 4 is an enlarged view of a portion of the carrier with the data storage device retained therein.
Figure 5:
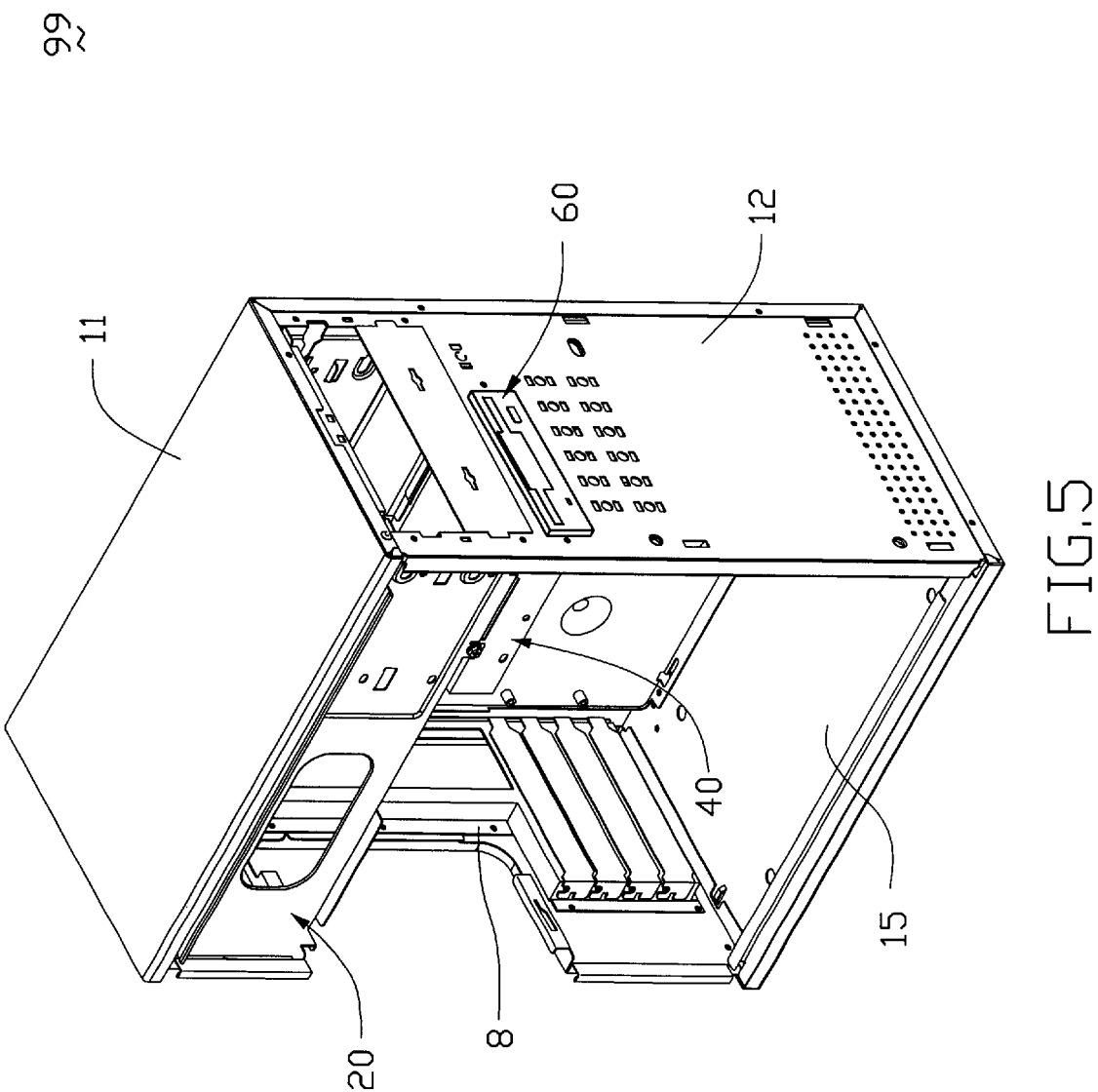
FIG. 5 is an assembled view of FIG. 1.

An opening 13 is defined in the front panel 12 of the chassis 10 aligning with the space defined between the side plates 44 of the disk drive carrier 40 for reception of the disk drive 60 in the disk drive carrier 40. Also referring to FIGS. 3 and 4, the securing device 30 comprises two bolts 70 mounted to inner-threaded holes (not shown) defined in a bottom face 62 of the disk drive 60. The bolts 70 have an expanded head 72 and a threaded post 76. The bolts 70 are secured to the bottom face 62 of the disk drive 60 such that a predetermined distance is maintained between the head 72 and the bottom face 62 of the disk drive 60. In the embodiment illustrated, a shoulder 74 is formed between the threaded post 76 and the head 72 for contacting the bottom face 62 and thus determining the predetermined distance.

Figure 2:
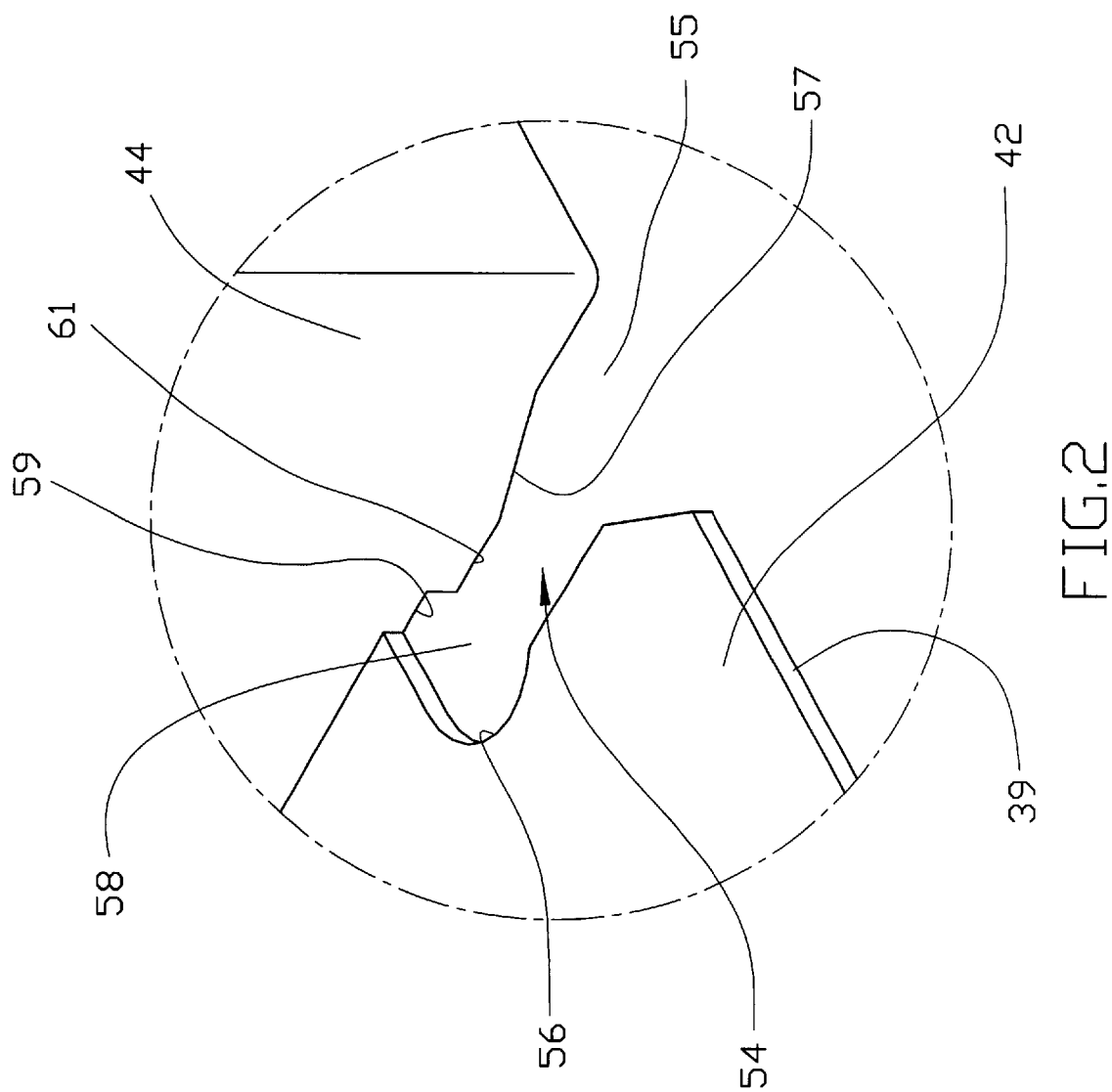
FIG. 2 is an enlarged view of encircled portion II of FIG. 1.

Also referring to FIG. 2, slots 54 are defined in the bottom plate 42 of the disk drive carrier 40 and extend along a portion of the side plates 44 for receiving the bolts 70 mounted to the disk drive 60. The slots 54 have a general width that is large enough to accommodate the shoulder 74 of the bolts, but is smaller than the head 72 thereby effectively retaining the disk drive 60 in the disk drive carrier 40.

In the embodiment illustrated, each slot 54 has a diverging entry opening 55 with an expanded hole 58 defined in an inner end of the slot 54. Preferably, a neck (not labeled) is formed between the diverging entry opening 55 and the expanded hole 58. The expanded hole 58 has an arc portion 56 for receive and thus effectively retaining the bolt 70 therein.

A raised portion 61 is formed on a lower edge 59 of the corresponding side plate 44 whereby a difference in altitude is formed between the raised portion 61 and an underside face 39 of the bottom plate 42 of the disk drive carrier 40 substantially corresponding to the predetermined distance between the head 72 of the bolt 70 and the bottom face 62 of the disk drive 60. The raised portion 61 is connected to the lower edge 59 by a ramp section 57 whereby when the bolt 70 is received in the slot 54 and moved to the expanded hole 58, the head 72 of the bolt 70 interacts with the raised portion 61 for application of a force to the disk drive 60 and thus securely fixing the disk drive 60 to the bottom plate 42 of the disk drive carrier 40.

Figure 6:
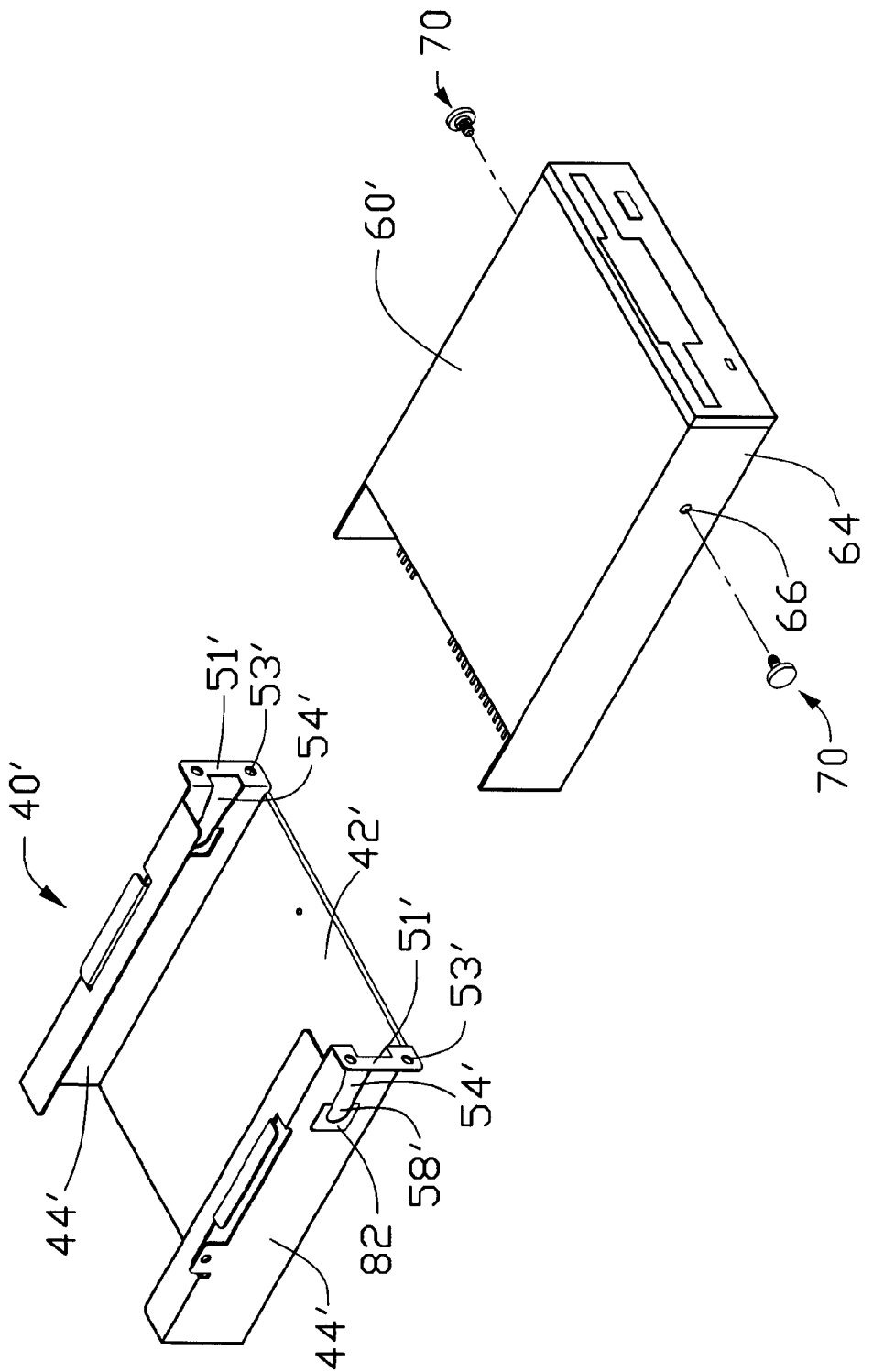
FIG. 6 shows a disk drive carrier in accordance with a second embodiment of the present invention together with the data storage device to be retained therein.

FIG. 6 shows a second embodiment in accordance with the present invention. A disk drive carrier 40' comprises a bottom plate 42' from which opposite side plates 44' extend. Each side plate 44' forms a front flange 51' abutting against the front panel 12 of the chassis 10. Holes 53' are defined in the front flange 51' and aligned with the holes 17 of the front panel 12 for receiving fasteners (not shown) to secure the disk drive carrier 40' to the chassis 10. Each side plate 44' defines a slot 54' having an inner end hole 58' around which a raised portion 82 of the side plate 44' is formed.

The disk drive 60' defines an inner-threaded hole 66 in each side face 64 thereof for engaging with the corresponding bolt 70. The expanded head 72 of the bolt 70 is maintained separated from the side face 64 by the shoulder 74 thereof for being received in the corresponding slot 54' and retained in the end hole 58'. The head 72 of the bolt 70 interacts with the raised portion 82 of the side plate 44' thereby applying a force to the disk drive 60' to firmly secure the disk drive 60' in the disk drive carrier 40'.

Figure 7:
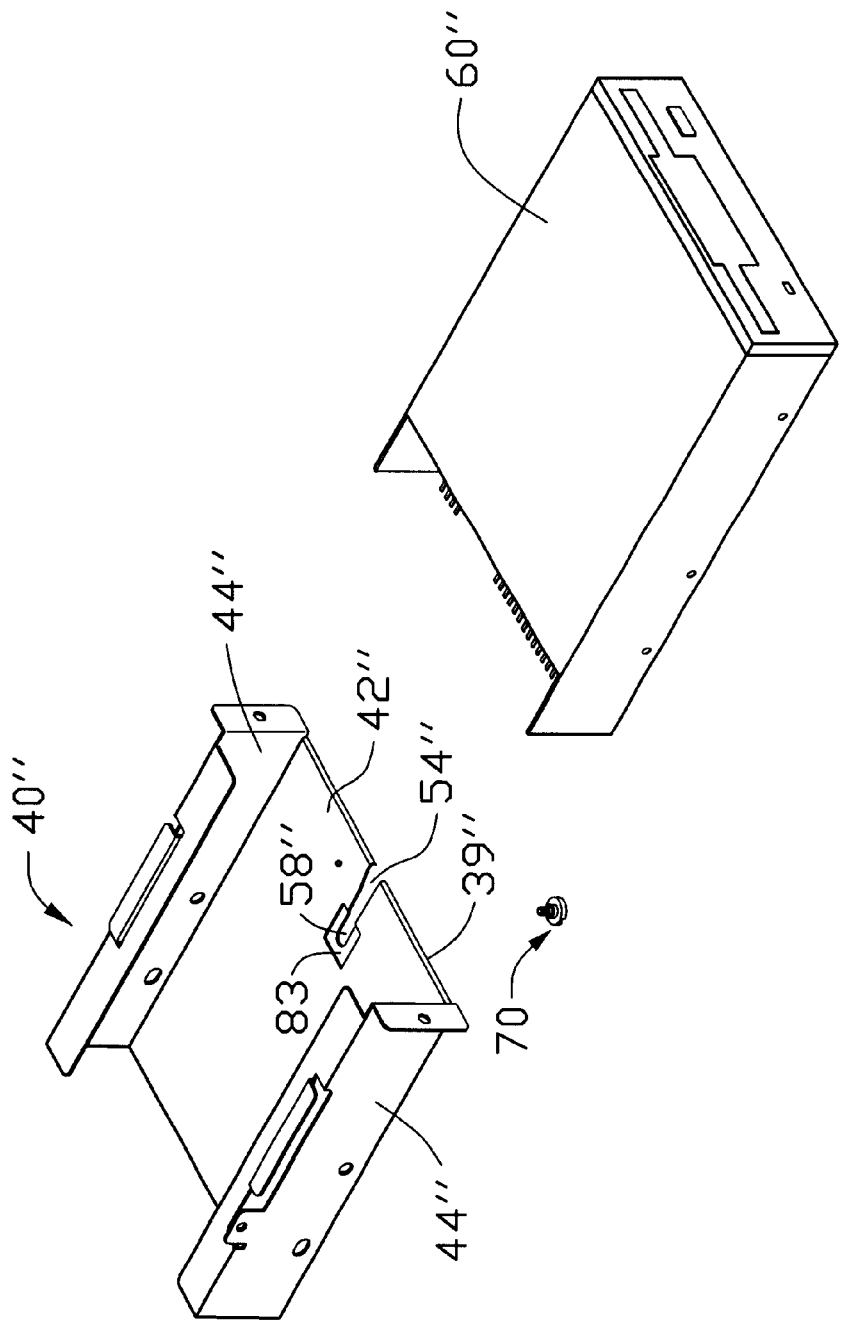
FIG. 7 shows a disk drive carrier in accordance with a third embodiment of the present invention together with the data storage device to be retained therein.

FIG. 7 shows a third embodiment of the present invention. A disk drive carrier 40" comprises a bottom plate 42" from which two side plates 44" extending for accommodating a disk drive 60" therebetween. A slot 54" is defined in the bottom plate 42" having an inner end 58" around which a raised portion 83 of the bottom plate 42" is formed on an underside face 39" thereof. The disk drive 60" defines an inner-threaded hole (not shown) in a bottom face thereof for engaging with the bolt 70 with a distance kept between the expanded head 72 of the bolt 70 and the bottom face of the disk drive 60" for inserting the bolt 70 into the slot 54". The head 72 of the bolt 70 interacts with the raised portion 83 for applying a force to the disk drive 60" thereby securely fixing the disk drive 60" in the disk drive carrier 40".

Although the present invention has been described with reference to the preferred embodiments, it is apparent to those skilled in the art that a variety of modifications and changes may be made without departing from the scope of the present invention which is intended to be defined by the appended claims.

What is claimed is:

1. A device for securing a computer data storage device in a computer enclosure comprising a carrier fixed in the enclosure and defining a space for accommodating the data storage device, the carrier having at least a plate in which at least one slot is defined, the slot having an inner end around which a raised portion is formed on the plate, a projection being attached to a face of the data storage device, the projection having an expanded head separated from the face a predetermined distance whereby the projection is received in the slot and retained at the inner end thereof with the head engaging with and interacting with the raised portion for applying a force to the data storage device to securely fix the data storage device on the plate.

2. The device as claimed in claim 1, wherein the projection comprises a threaded post threadingly engaging with an inner-threaded hole defined in the face of the data storage device, a shoulder being formed between the threaded post and the head for determining the predetermined distance.

3. The device as claimed in claim 1, wherein the carrier comprises a bottom plate with which a bottom face of the data storage device engages, the projection being mounted to the bottom face of the data storage device for being received in the slot defined in the bottom plate.

4. The device as claimed in claim 3, wherein the carrier comprises two side plates extending from the bottom plate for accommodating the data storage device therebetween, two slots being defined in the bottom plate and extending along a portion of the side plates for receiving two bolts mounted to the bottom face of the data storage device, a raised portion being formed on a lower edge of each side plate corresponding to the inner end of the corresponding slot for interacting with the head of the corresponding bolt.

5. The device as claimed in claim 3, wherein the carrier comprises two side plates extending from the bottom plate for accommodating the data storage device therebetween, a slot being defined in each side plate for receiving a bolt mounted to a side face of the data storage device that corresponds to the side plate, a raised portion being formed on the side plate around an inner end of the slot for interacting with the head of the corresponding bolt.

6. The device as claimed in claim 2, wherein an expanded hole defined in the plate at the inner end of the slot for effectively retaining the bolt.

7. The device as claimed in claim 6, wherein the slot comprises a diverging entry opening and forms a neck between the entry opening and the expanded hole.

8. A computer enclosure comprising:

a chassis defining an interior space;

a first carrier arranged in the interior space and attached to the chassis, the carrier defining a space adapted to receive a first data storage device, the carrier comprising at least a plate in which at least one slot is defined, the slot having an inner end around which a raised portion is formed on the plate, a projection being attached to a face of the first data storage device, the projection having an expanded head separated from the face a predetermined distance whereby the projection is received in the slot and retained at the inner end thereof with the head engaging with and interacting with the raised portion for applying a force to the first data storage device to securely fix the first data storage device to the plate.

9. The computer enclosure as claimed in claim 8, wherein the chassis comprises front and rear panels with a second carrier connected to and extending between the front and rear panels, the second carrier comprising a bottom wall defining a space thereabove adapted to receive at least a second data storage device therein, the first carrier being attached to the bottom wall of the second carrier and the front panel of the chassis, an opening being defined in the front panel for insertion of the first data storage device into the first carrier.

10. The computer enclosure as claimed in claim 9, wherein two L-shaped rails are formed on the bottom wall of the second carrier and wherein the first carrier comprises a bottom plate from which two side plates extend, each side plate forming an L-shaped slide tab for slidably engaging with the corresponding rail of the second carrier thereby attaching the first carrier to the second carrier.

11. The computer enclosure as claimed in claim 10, wherein aligned holes are defined in the first carrier and the front panel of the chassis for receiving fasteners to secure the first carrier to the chassis.

12. The computer enclosure as claimed in claim 10, wherein a lug is formed on one of the side plates of the first carrier and a corresponding tab is formed on the second carrier for engaging with the lug, aligned holes being defined in the lug and tab for receiving a fastener to secure the first carrier to the second carrier.

13. A carrier for supporting a data storage device in a computer enclosure comprising a bottom plate and opposite side plates extending from the bottom plate defining a space for accommodating the data storage device, at least one slot being defined in one of the bottom and side plates of the carrier adapted to receive a projection mounted to a corresponding face of the data storage device, the projection having an expanded head spaced from the face of the data storage device, the plate in which the slot is defined forming a raised portion proximate an inner end of the slot whereby when the projection is received in the slot and moved to the inner end thereof, the raised portion interacts with the head of the projection to apply a force to the data storage device and thus securely fix the data storage device in the carrier.

14. The carrier as claimed in claim 13, wherein two slots are defined in the bottom plate and extend along a portion of the side plates for receiving two projections formed on a bottom face of the data storage device, a raised portion being formed on a lower edge of each side plate corresponding to the inner end of the corresponding slot for interacting with the head of the corresponding projection.

15. The carrier as claimed in claim 13, wherein each side plate defines a slot for receiving a projection formed on a side face of the data storage device that corresponds to the side plate, a raised portion being formed on the side plate around an inner end of the slot for interacting with the head of the corresponding projection.

16. The carrier as claimed in claim 13, wherein the slot is defined in the bottom plate of the carrier for receiving a projection formed on a bottom plate of the data storage device.

* * * * *